US008569795B2

United States Patent
Kono et al.

(10) Patent No.: US 8,569,795 B2
(45) Date of Patent: Oct. 29, 2013

(54) SEMICONDUCTOR DEVICE AND METHOD OF MANUFACTURING THE SAME

(75) Inventors: Hiroshi Kono, Kanagawa (JP); Yukio Nakabayashi, Kanagawa (JP); Takashi Shinohe, Kanagawa (JP); Makoto Mizukami, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/217,472

(22) Filed: Aug. 25, 2011

(65) Prior Publication Data
US 2012/0228631 A1  Sep. 13, 2012

(30) Foreign Application Priority Data
Mar. 10, 2011  (JP) ................... 2011-052788

(51) Int. Cl.
*H01L 33/32* (2010.01)
*H01L 29/80* (2006.01)
*H01L 29/16* (2006.01)
*H01L 27/11* (2006.01)
*H01L 27/10* (2006.01)

(52) U.S. Cl.
USPC ............. 257/103; 257/134; 257/77; 257/315; 257/296

(58) Field of Classification Search
USPC ............. 257/103, 134, 77, 315, 296, E21.23, 257/E21.05; 438/135, 185
See application file for complete search history.

(56) References Cited

U.S. PATENT DOCUMENTS

2004/0183080 A1* 9/2004 Kusumoto et al. ............. 257/77
2005/0012143 A1* 1/2005 Tanaka et al. ................. 257/328
2006/0261347 A1* 11/2006 Ryu et al. ........................ 257/77
2009/0078942 A1* 3/2009 Kono et al. ...................... 257/77

FOREIGN PATENT DOCUMENTS

JP        8-288500        11/1996
(Continued)

OTHER PUBLICATIONS

Kenya Yamashita, et al., "Normally-off 4H-SiC Power MOSFET with Submicron Gate", Materials Science Forum vols. 600-603, 2009, pp. 1115-1118.

(Continued)

*Primary Examiner* — Chuong A Luu
*Assistant Examiner* — Moin Rahman
(74) *Attorney, Agent, or Firm* — Oblon, Spivak, McClelland, Maier & Neustadt, L.L.P.

(57) ABSTRACT

A semiconductor device of an embodiment includes: a silicon carbide substrate including first and second principal surfaces; a first conductive-type first silicon carbide layer provided on the first principal surface of the silicon carbide substrate; a second conductive-type first silicon carbide region formed on a surface of the first silicon carbide layer; a first conductive-type second silicon carbide region formed on a surface of the first silicon carbide region; a second conductive-type third silicon carbide region formed on the surface of the first silicon carbide region; a gate insulating film continuously formed on the surfaces of the first silicon carbide layer, the first silicon carbide region, and the second silicon carbide region; a first electrode formed of silicon carbide formed on the gate insulating film; a second electrode formed on the first electrode; an interlayer insulating film for covering the first and second electrodes; a third electrode electrically connected to the second silicon carbide region and the third silicon carbide region; and a fourth electrode formed on the second principal surface of the silicon carbide substrate.

11 Claims, 12 Drawing Sheets

(56) References Cited

FOREIGN PATENT DOCUMENTS

| | | |
|---|---|---|
| JP | 10-303412 | 11/1998 |
| JP | 2005-5438 | 1/2005 |
| JP | 3711989 B2 | 11/2005 |
| JP | 2008-117878 | 5/2008 |
| JP | 2009-253072 | 10/2009 |
| WO | WO 2007/108439 A1 | 9/2007 |

OTHER PUBLICATIONS

Japanese Office Action mailed on Feb. 12, 2013, in Japanese Patent Application No. 2011-052788 filed Mar. 10, 2011 (with English Translation).

Office Action mailed Aug. 6, 2013, in Japanese patent application No. 2011-052788 filed Mar. 10, 2011 (with English-language translation).

\* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Applications No. 2011-052788, filed on Mar. 10, 2011; the entire contents of which are incorporated herein by reference.

FIELD

Embodiments described herein relate generally to a semiconductor device and a method of manufacturing the same.

BACKGROUND

Silicon carbide (hereinafter, also referred to as SiC) is expected as a material of a next-generation power semiconductor device. The SiC has excellent physicality such as a three-fold band gap, approximately ten-fold breakdown field strength, and an approximately three-hold thermal conductivity as compared to Si. By utilizing such characteristics, the power semiconductor device capable of operating at a high temperature with an extremely low loss may be realized.

There are various types of high blocking voltage semiconductor devices utilizing such characteristics of the SiC. A double implantation MOSFET (hereinafter, referred to as DIMOSFET) in which a p-well and a source region are formed by ion implantation is known as one of them.

Since a planar process capable of forming a channel with high accuracy by the ion implantation is used, the DIMOSFET is easily manufactured. Also, since gate driving is voltage-controlled, power of a drive circuit may be made small, and this is the excellent device also applicable to concurrent motion.

However, the device obtained by using the SiC has high metal contact resistance in a source and drain region in general, and this impedes device characteristics. In order to solve this problem, technology to form a low-resistance silicide film by annealing at a high temperature of 800 to 1000° C. by bringing metal such as nickel into contact with the SiC is reported.

On the other hand, a gate electrode is formed of doped polysilicon, and a contact forming temperature of a polycilicon electrode and a pad electrode is lower than the contact forming temperature of the source drain region and it is necessary to separately perform contact anneal of both, so that the process is complicated.

DETAILED DESCRIPTION

Figure 1:
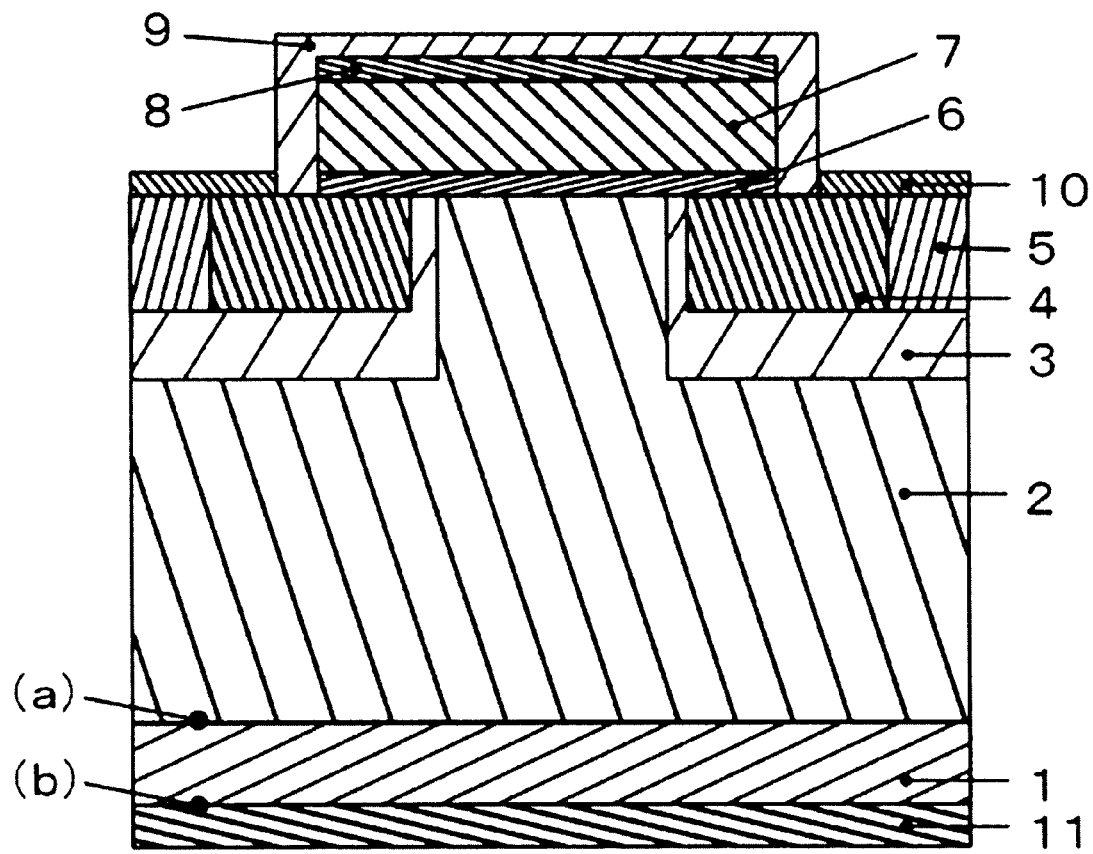
FIG. 1 is a schematic cross-sectional diagram of a semiconductor device of a first embodiment.
Figure 2:
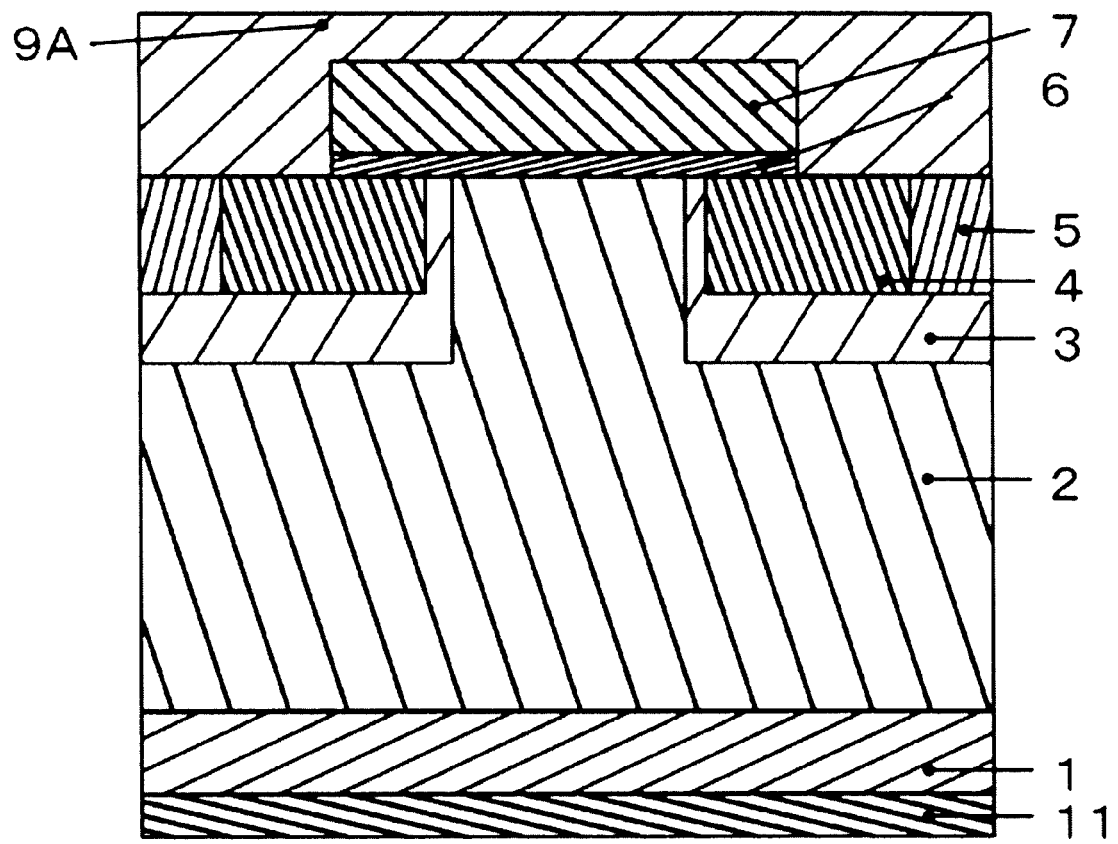
FIG. 2 is a schematic cross-sectional diagram for illustrating a manufacturing step of the semiconductor device of the first embodiment.

A semiconductor device of an embodiment includes: a silicon carbide substrate including first and second principal surfaces; a first conductive-type first silicon carbide layer provided on the first principal surface of the silicon carbide substrate; a second conductive-type first silicon carbide region formed on a surface of the first silicon carbide layer; a first conductive-type second silicon carbide region formed on a surface of the first silicon carbide region; a second conductive-type third silicon carbide region formed on the surface of the first silicon carbide region; a gate insulating film continuously formed on the surfaces of the first silicon carbide layer, the first silicon carbide region, and the second silicon carbide region; a first electrode formed of silicon carbide formed on the gate insulating film; a second electrode formed on the first electrode; an interlayer insulating film for covering the first and second electrodes; a third electrode electrically connected to the second silicon carbide region and the third silicon carbide region; and a fourth electrode formed on the second principal surface of the silicon carbide substrate.

Embodiments of the invention will be described below with reference to the drawings.

Hereinafter, the embodiments are described with reference to the drawings. Meanwhile, the drawings are schematic diagrams and relationship between a thickness and a planar dimension, a ratio of a thickness of each layer and the like are different from actual ones. An example of an n-channel MOSFET is herein described by setting a first conductive type to an n-type and a second conductive type to a p-type. When dopant and the like are property changed, however, this may be applied to a p-channel MOSFET by setting the first conductive type to the p-type and the second conductive type to the n-type. Meanwhile, the thicknesses of the layer and the region are intended to mean distances in a vertical direction of the principal surface of the silicon carbide substrate.

First Embodiment

A semiconductor device of an embodiment includes: a silicon carbide substrate 1 including first (a) and second (b) principal surfaces; a first conductive-type first silicon carbide layer 2 provided on the first principal surface of the silicon carbide substrate; a second conductive-type first silicon carbide region 3 formed on a surface of the first silicon carbide layer; a first conductive-type second silicon carbide region 4 formed on a surface of the first silicon carbide region; a second conductive-type third silicon carbide region 5 formed on the surface of the first silicon carbide region; a gate insulating film 6 continuously formed on the surfaces of the first silicon carbide layer, the first silicon carbide region, and the second silicon carbide region; a first electrode 7 formed of silicon carbide formed on the gate insulating film; a second electrode 8 formed on the first electrode 7; an interlayer insulating film 9 for covering the first and second electrodes 7 and 8; a third electrode 10 electrically connected to the second silicon carbide region 4 and the third silicon carbide region 5; and a fourth electrode 11 formed on the second principal surface of the silicon carbide substrate 1.

FIG. 1 is a schematic cross-sectional diagram of a configuration of a silicon carbide vertical field effect transistor which is the semiconductor device of this embodiment. The silicon carbide vertical field effect transistor is provided with the silicon carbide substrate 1 including the first (a) and second (b) principal surfaces. The SiC substrate 1 is a hexagonal silicon carbide substrate (n$^+$ substrate) with impurity concentration of approximately $5 \times 10^{18}$ to $1 \times 10^{19}$ cm$^{-3}$ including nitrogen (N) as an n-type impurity, for example.

An n-type first silicon carbide layer (n$^-$ layer) 2 with the impurity concentration of approximately $5 \times 10^{15}$ to $5 \times 10^{16}$ cm$^{-3}$ of the n-type impurity is formed on the first principal surface of the silicon carbide substrate 1. A film thickness of the first silicon carbide layer 2 is approximately 5 to 10 μm, for example.

A p-type first silicon carbide region (p-well region) 3 with the impurity concentration of approximately $5 \times 10^{15}$ to $5 \times 10^{18}$ cm$^{-3}$ of p-type impurity is formed on a part of a surface of the first silicon carbide layer 2. A depth of the first silicon carbide region 3 is approximately 0.6 μm, for example.

An n-type second silicon carbide region (source region) 4 with the impurity concentration of approximately $1 \times 10^{20}$ of the n-type impurity is formed on a part of a surface of the first silicon carbide region 3. The depth of the second silicon carbide region 4 is smaller than that of the first silicon carbide region 3 and is approximately 0.3 μm, for example.

Also, a p-type third silicon carbide region (p-well contact region) 5 with the impurity concentration of approximately $1 \times 10^{19}$ to $1 \times 10^{20}$ cm$^{-3}$ of the p-type impurity is formed on a part of the surface of the first silicon carbide region 3 to be lateral to the n-type second silicon carbide region 4. The depth of the third silicon carbide region 5 is approximately 0.3 μm, for example.

Further, the gate insulating film 6 is continuously formed on the surfaces of the first silicon carbide layer 2 and the first and second silicon carbide regions 3 and 4 across the regions and the layer. An Si oxide film and a high-k insulating film may be applied to the gate insulating film 6, for example.

The first electrode (gate electrode) 7 is formed on the gate insulating film 6. Poly-SiC or amorphous SiC may be applied to the first electrode 7.

The second electrode (gate electrode) 8 is formed on the first electrode 7, so that a low-resistance gate electrode may be realized. A metal silicide film or a carbon film may be used as the second electrode 8. Specifically, any metal silicide of Ni, Mo, Al, W, V, Co, and Ti, mixture of the metal silicides with an appropriate rate, graphite, and graphene may be used for the second electrode 8.

Since the poly-SiC or the amorphous SiC is used for the first electrode 7, roughness of a gate contact region defined between a surface of the first electrode 7 and an upper surface of the second electrode 8 is small, and contact resistance may be made smaller. Also, when the poly SiC or the amorphous SiC is used for the first electrode 7 and the metal silicide film or the carbon film is used for the second electrode 8, the contact resistance and sheet resistance of the gate electrode may be made smaller as compared to the conventional example. Further, in a conventional structure, when the contact resistance of the third silicon carbide region 4 is decreased (due to a problem of increase in the contact resistance because of the roughness generated on the contact region of the gate electrode by high-temperature anneal), there is trade-off relationship between the same and the contact resistance of the gate electrode; however, by using this structure, the resistance of the third silicon carbide region 4 may be made smaller as compared to the conventional example in which multicrystal silicon is used.

Also, by using the poly SiC or the amorphous SiC for the first electrode 7, a work function of the gate electrode may be more widely changed as compared to the conventional example. Especially, by using the poly SiC or the amorphous SiC with the work function of 4.0 eV or smaller, it becomes possible to more widely decrease a threshold as compared to the conventional example, and a MOSFET with higher driving force may be realized.

A region of the interlayer insulating film 9 formed of a silicon oxide film, for example, is formed so as to cover the first and second electrodes 7 and 8.

The first silicon carbide region 3 interposed between the second silicon carbide region 4 and the first silicon carbide layer 2 under the gate electrode becomes a channel region.

The third electrode (source/p-well common electrode) 10 electrically connected to the second silicon carbide region 4 and the third silicon carbide region 5 is provided. The metal film or the carbon film may be used for the third electrode 10, and any of at least one of metals of Ni, Mo, Al, W, V, Co, and Ti, the metal silicide of at least one of the metals, mixture of at least one of the metals and the metal silicide of at least one of the metals, graphite, and graphene may be used, for example.

Also, the fourth electrode (drain electrode) 11 is formed on the second principal surface of the silicon carbide substrate 1. The metal film or the carbon film may be used for the fourth electrode 11, and any of at least one of the metals of Ni, Mo, Al, W, V, Co, and Ti, the metal silicide of at least one of the metals, the mixture of at least one of the metals and the metal silicide of at least one of the metals, graphite, and graphene may be used, for example.

Meanwhile, in this embodiment, although the nitrogen (N) and phosphorus (P) are preferable as the n-type impurity, for example, it is also possible to apply arsenic (As) and the like. Also, although aluminum (Al) is preferable as the p-type impurity, for example, it is also possible to apply boron (B) and the like.

Next, a method of manufacturing the semiconductor device of the embodiment is described. FIGS. 2 to 8 are schematic cross-sectional step diagrams illustrating the method of manufacturing the semiconductor device of this embodiment.

The method of manufacturing the semiconductor device of this embodiment is characterized in performing a contact anneal process simultaneously to the second electrode formed on the first electrode formed of the silicon carbide on the gate insulating film and the third electrode formed on the second and third silicon carbide regions.

A low-resistance silicon carbide substrate 1 having a hexagonal crystal lattice with a thickness of 300 μm, for example, including phosphorus (P) or nitrogen (N) as the n-type impurity with the impurity concentration of approximately $1 \times 10^{19}$ cm$^{-3}$, is prepared. Then, a high-resistance silicon carbide layer 2 with the thickness of approximately 10 μm including N, for example, as the n-type impurity with the impurity concentration of approximately $1 \times 10^{16}$ cm$^{-3}$ is grown on one principal surface of the silicon carbide substrate 1 by an epitaxial growth method.

Thereafter, a first mask material of SiO$_2$ is formed by patterning by photolithography and etching. Ion implantation of Al as the p-type impurity in the first silicon carbide layer 2 is performed by using the first mask material as an ion implantation mask to form the first silicon carbide region 3. Herein, it is possible to perform the ion implantation by adding N as the n-type impurity in order to adjust final concentration of the first silicon carbide region 3.

Thereafter, a second mask material of SiO$_2$ is formed by patterning by photolithography and etching. The ion implantation of P as the n-type impurity in the first silicon carbide layer 2 is performed by using the second mask material as the ion implantation mask to form the second silicon carbide region 4.

Thereafter, a third mask material of SiO$_2$ is formed by patterning by photolithography and etching. The ion implantation of Al as the p-type impurity in the SiC layer 2 is performed by using the third mask material as the ion implantation mask to form the third silicon carbide region 5.

Next, after activation annealing at temperature which is not lower than 1500° C. and not higher than 2000° C., the gate insulating film 6 is formed on the first silicon carbide layer 2 on which a variety of semiconductor regions are formed by the ion implantation by a known semiconductor process.

Next, poly SiC and amorphous SiC are formed as the first electrode 7 (gate electrode) on the gate insulating film 6 by the known semiconductor process. The known process to form the poly SiC includes film formation by a chemical vapor deposition (CVD) method, as an example. Also, the known process to form the amorphous SiC includes the same CVD method and sputtering as an example.

Figure 3:
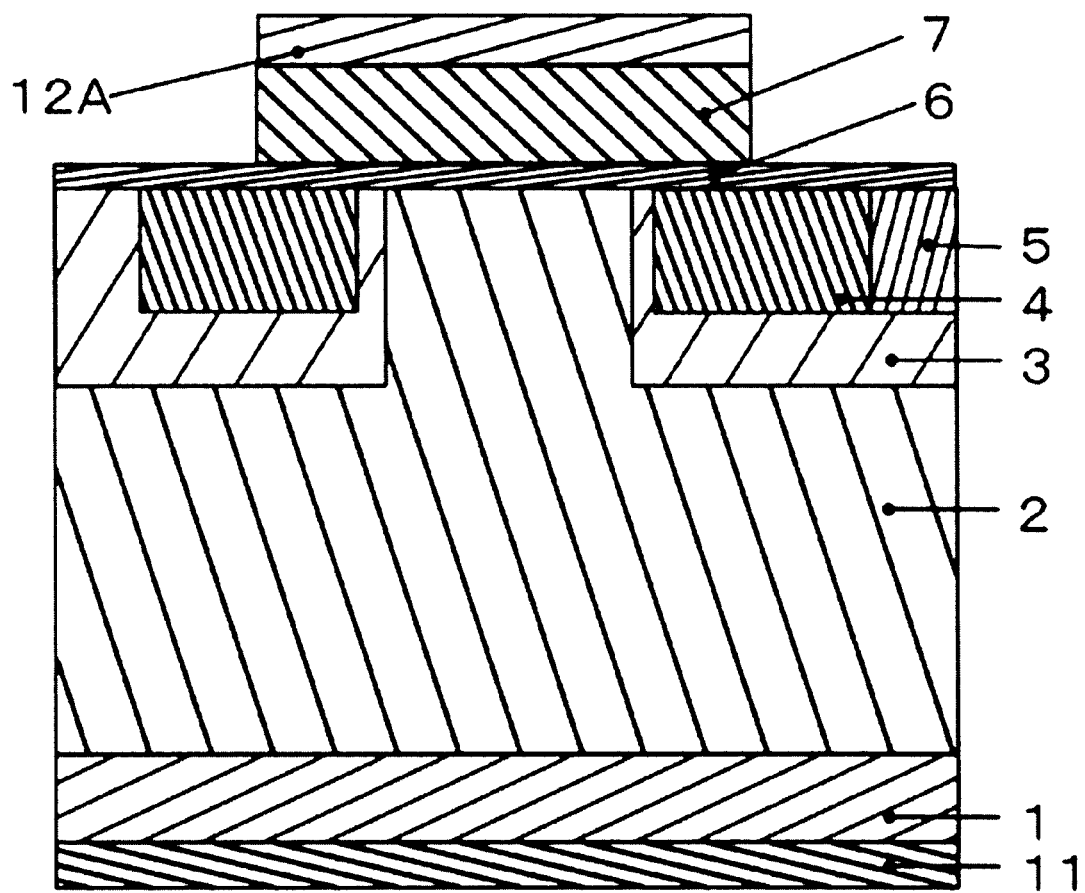
FIG. 3 is a schematic cross-sectional diagram for illustrating the manufacturing step of the semiconductor device of the first embodiment.

Next, a resist 12A is formed on the first electrode 7 as the mask material for patterning the gate electrode and the patterning of the first gate electrode is performed (FIG. 3).

Figure 4:
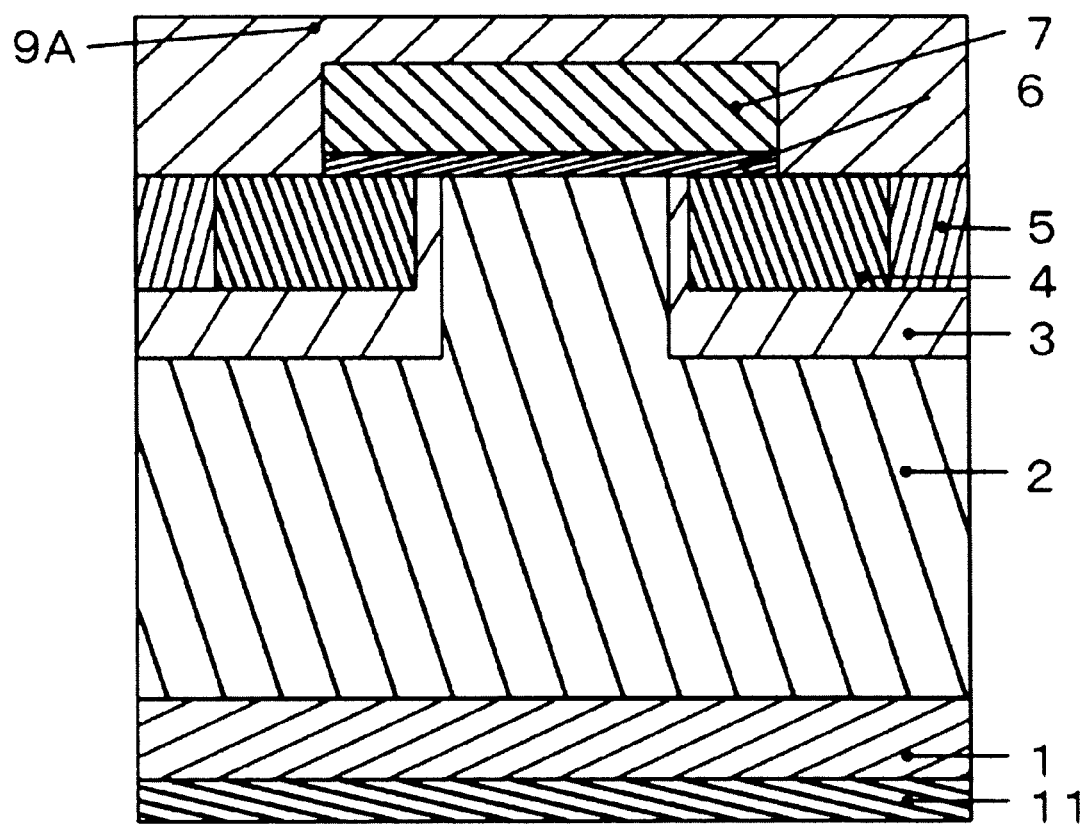
FIG. 4 is a schematic cross-sectional diagram for illustrating the manufacturing step of the semiconductor device of the first embodiment.

Thereafter, the resist 12A is removed and an interlayer insulating film 9A is deposited on the first electrode 7 (FIG. 4).

Figure 5:
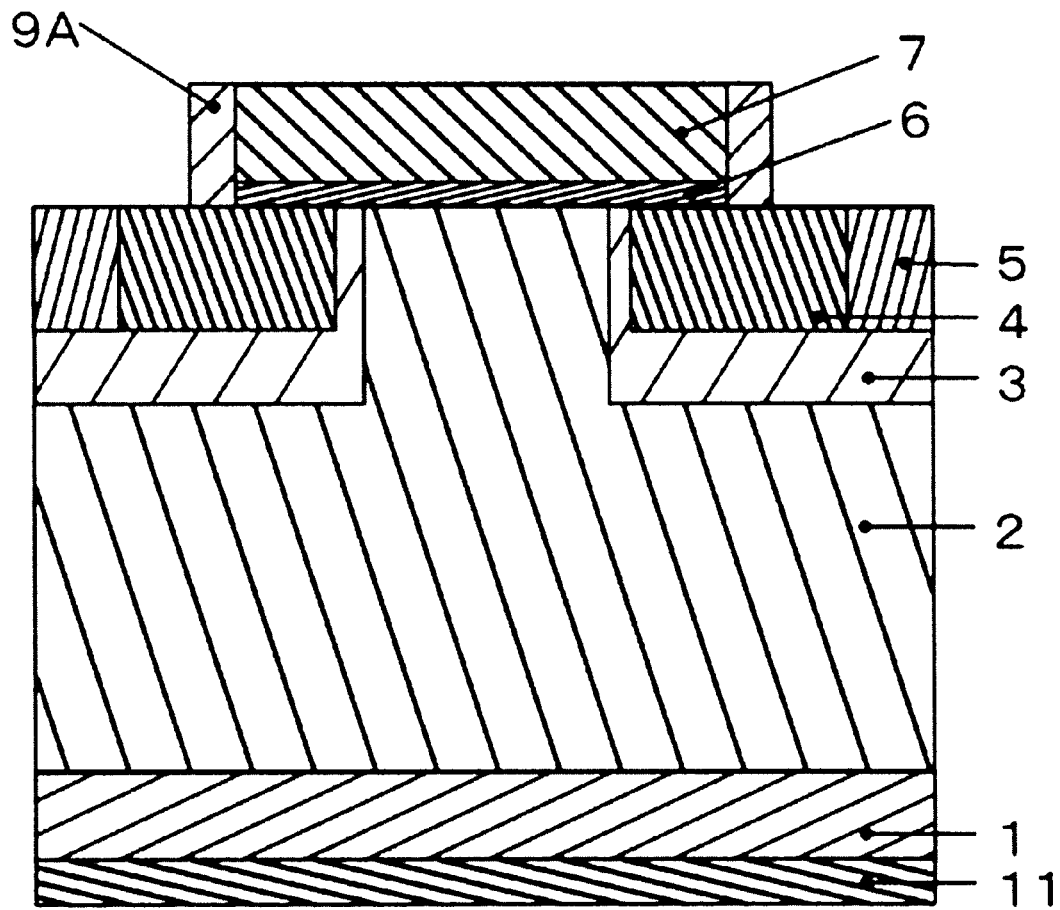
FIG. 5 is a schematic cross-sectional diagram for illustrating the manufacturing step of the semiconductor device of the first embodiment.

Thereafter, a source contact is opened by patterning the interlayer insulating film 9A by a RIE method using the mask material (FIG. 5).

Figure 6:
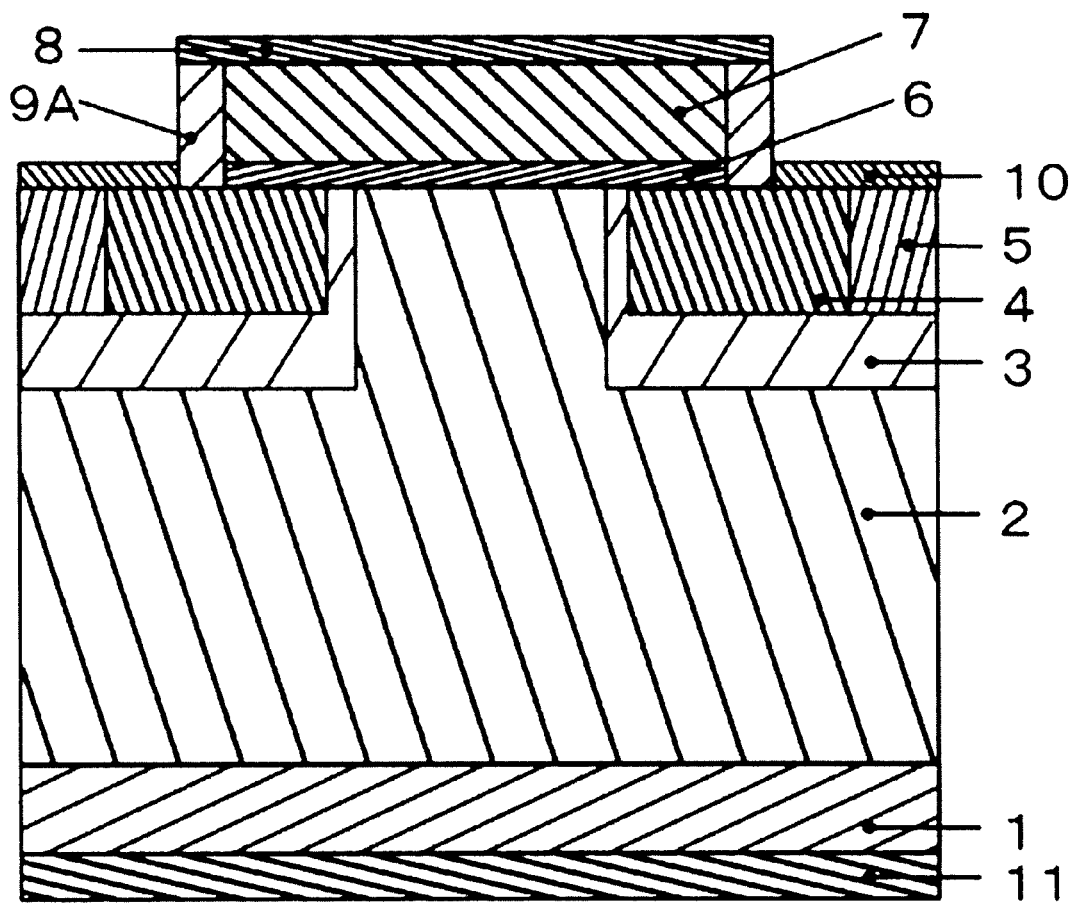
FIG. 6 is a schematic cross-sectional diagram for illustrating the manufacturing step of the semiconductor device of the first embodiment.

The metal or carbon is deposited by the vapor deposition method and the sputtering method to form a conductive film for the second electrode 8 and the third electrode 10 (FIG. 6). Next, the contact anneal process is simultaneously performed to the second electrode film 8 and the third electrode film 10. An annealing temperature is not lower than 800° C. and not higher than 1000° C. Unnecessary electrode film and insulating film are removed by the etching after the contact anneal. Since both of the second gate electrode film 8 and source electrode film 10 are formed on the SiC, both of the electrode films may be annealed at a comparative high temperature and the number of times of contact anneal may be decreased to one. Also, a salicide process may be adopted and the metal film becomes a metal silicide film by the contact anneal.

Figure 7:
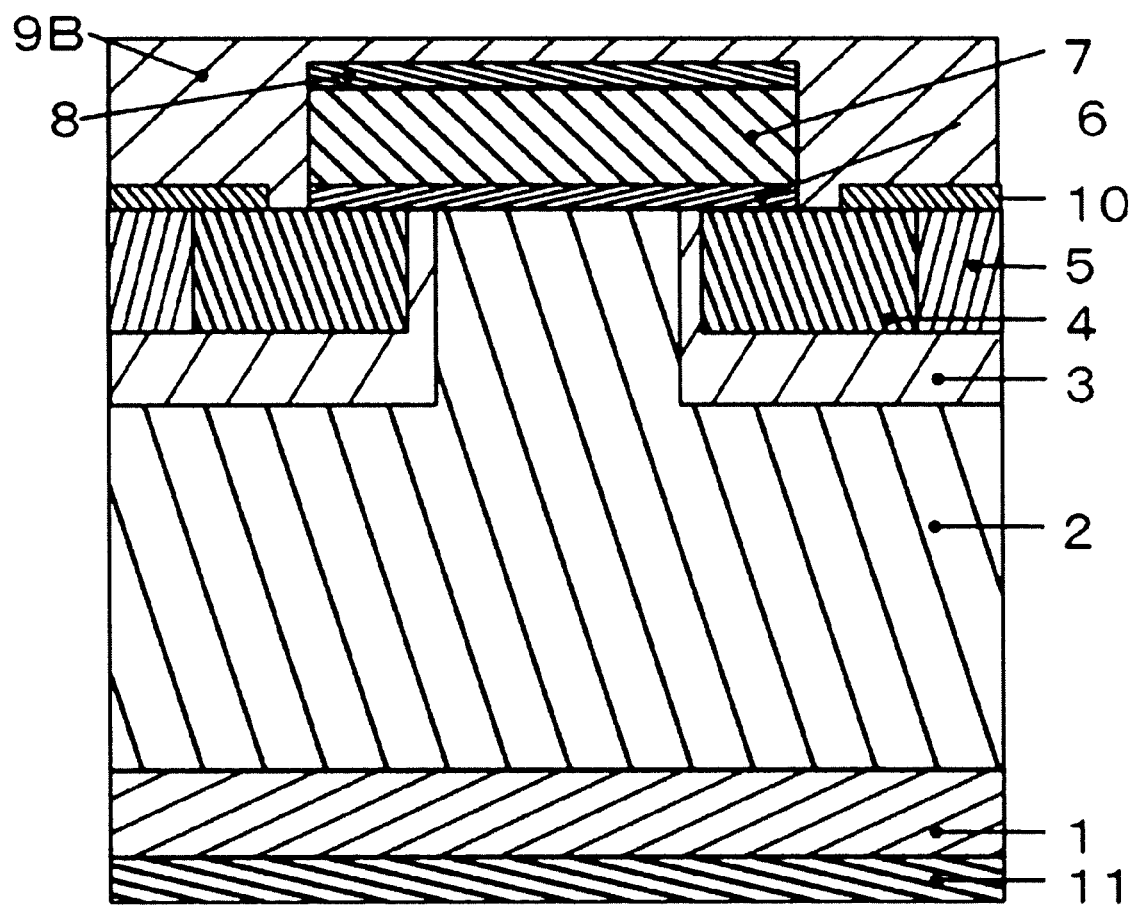
FIG. 7 is a schematic cross-sectional diagram for illustrating the manufacturing step of the semiconductor device of the first embodiment.

Thereafter, an interlayer insulating film 9B is deposited on the electrode film (FIG. 7).

Figure 8:
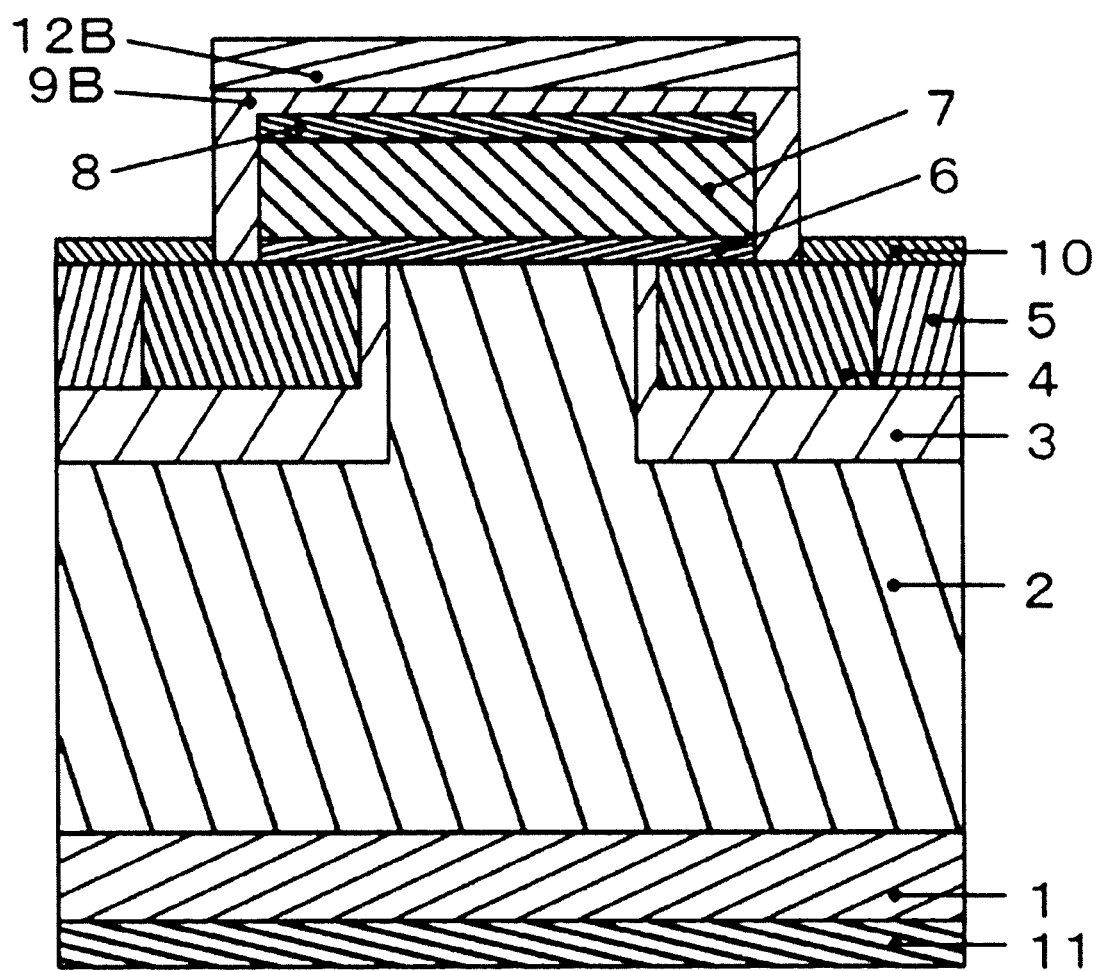
FIG. 8 is a schematic cross-sectional diagram for illustrating the manufacturing step of the semiconductor device of the first embodiment.

Next, a resist 12B is formed on the interlayer insulating film 9B as the mask material to simultaneously open the gate and the source contact, and the patterning is performed (FIG. 8).

In this manner, the semiconductor device illustrated in the schematic cross-sectional diagram in FIG. 1 is formed.

Second Embodiment

Figure 9:
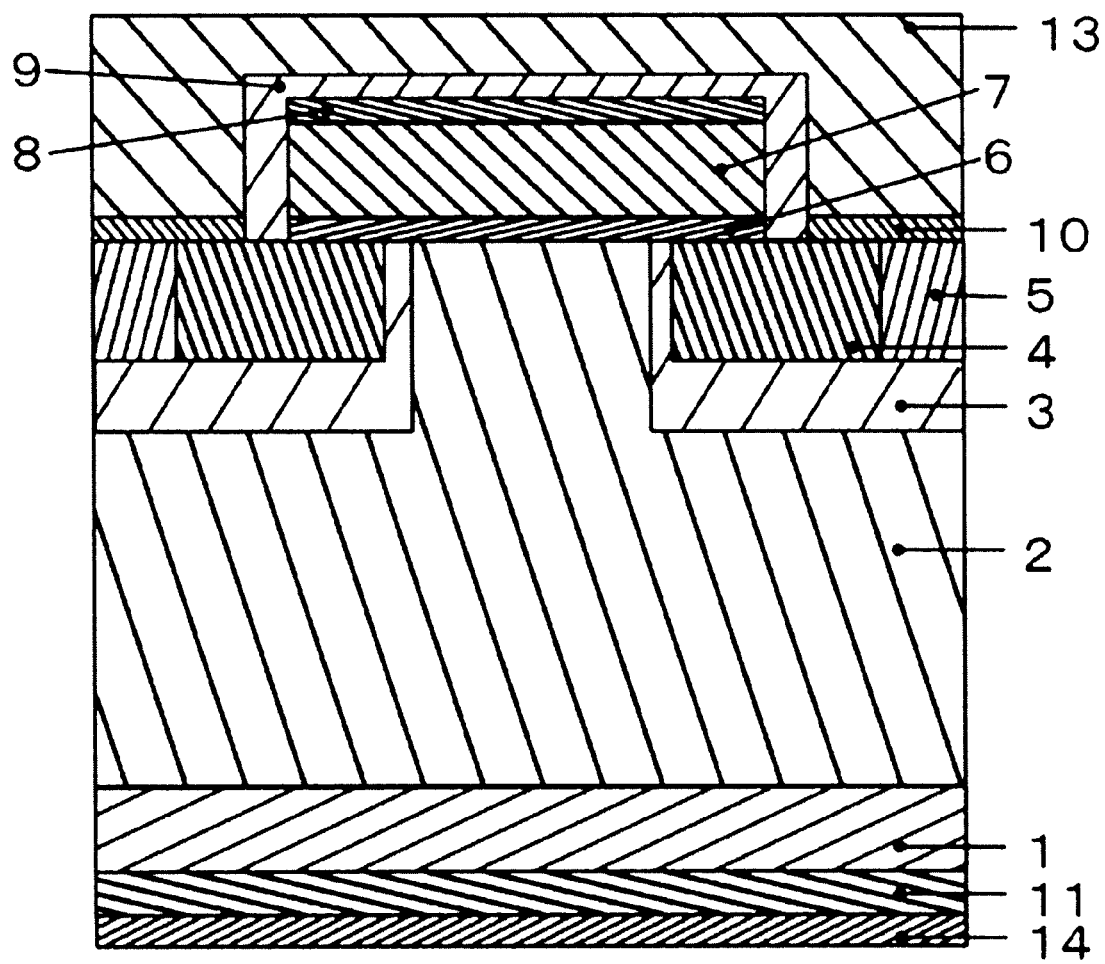
FIG. 9 is a schematic cross-sectional diagram of a semiconductor device of a second embodiment.

A second embodiment illustrated in a schematic cross-sectional diagram in FIG. 9 is a modification of the first embodiment. In the second embodiment, after the process in FIG. 8, the metal is deposited by the vapor deposition method, the sputtering method and the like, thereafter a fifth electrode 13 is formed by the lithography, and the metal is similarly deposited by the vapor deposition method and the sputtering method to form a sixth electrode 14 (FIG. 9). A passivation insulating film may be formed on the fourth electrode as necessary.

Third Embodiment

Figure 10:
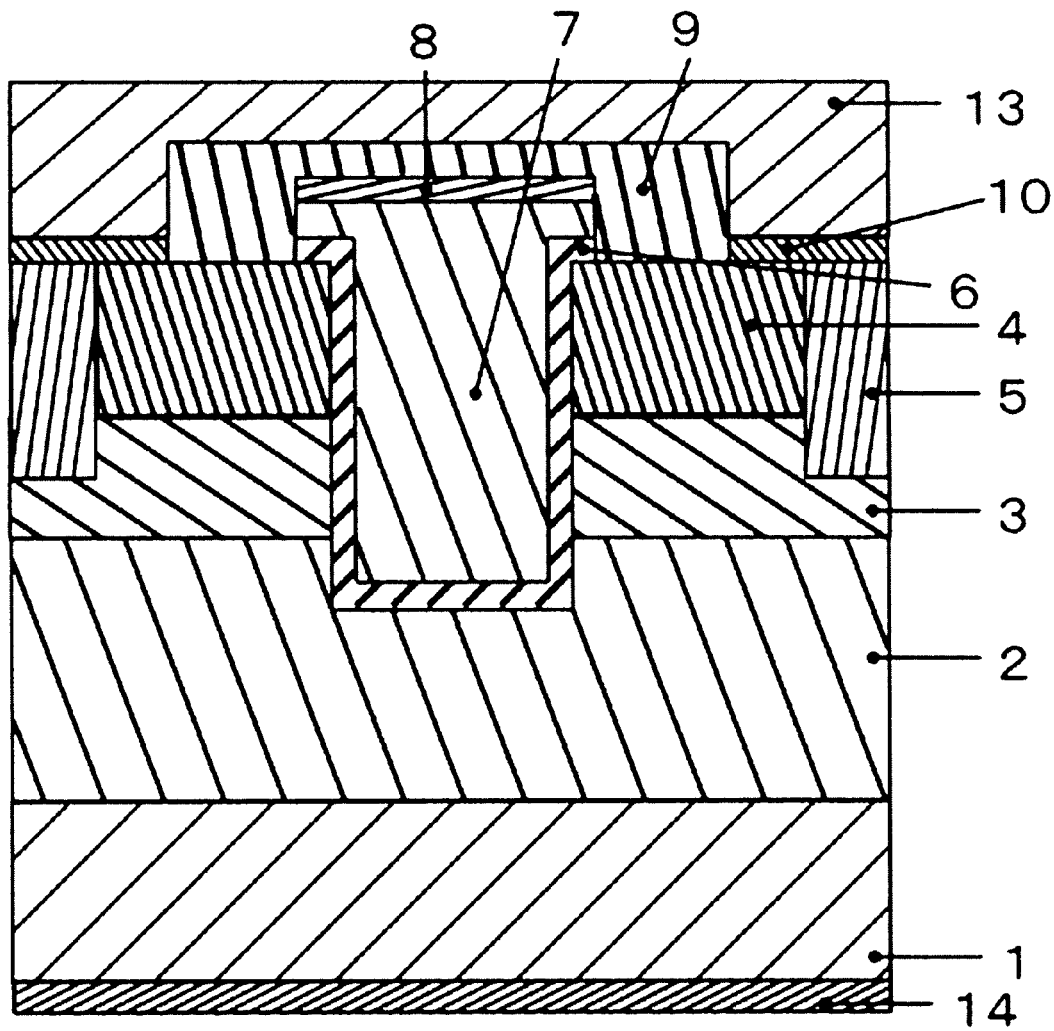
FIG. 10 is a schematic cross-sectional diagram of a semiconductor device of a third embodiment.

The semiconductor device according to a third embodiment illustrated in a schematic cross-sectional diagram in FIG. 10 is a trench-type device and is similar to the semiconductor device of the second embodiment except that the third silicon carbide region 5 is formed to have a depth larger than that of the second silicon carbide region 4. Before the gate insulating film 6 is formed, the first silicon carbide layer 2, the first and second silicon carbide regions 3 and 4 are etched by the RIE and the like to form a trench. The depth of the trench is 1 to 2 μm, for example, and the depth with which the gate insulating film is hardly broken is preferable. In the third embodiment, the first electrode 7 is formed in the trench and on a part of the surface of the second silicon carbide region 4. The salicide process described in the first embodiment may be similarly adopted also to the trench-type semiconductor device.

Fourth Embodiment

Figure 11:
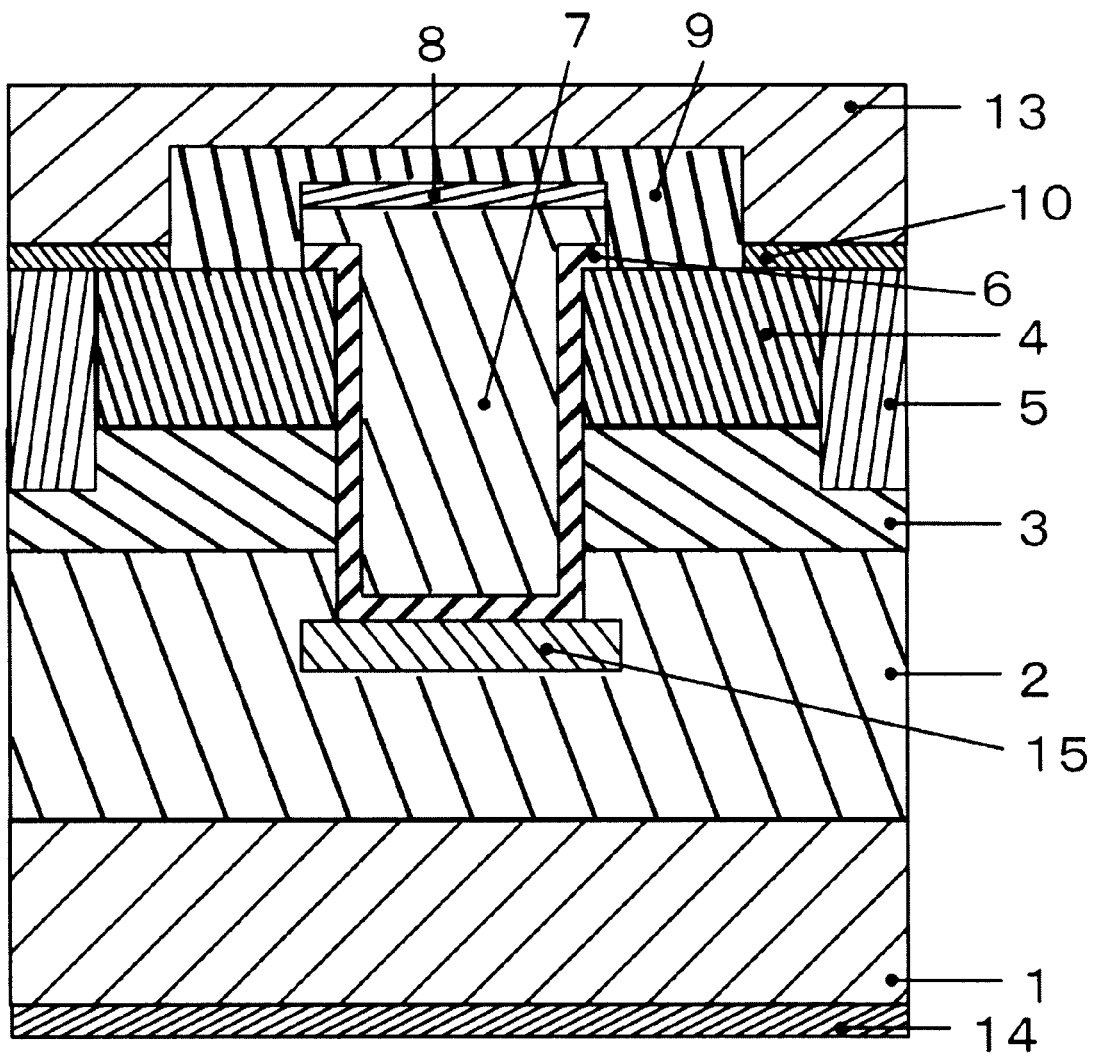
FIG. 11 is a schematic cross-sectional diagram of a semiconductor device of a fourth embodiment.

The semiconductor device of a fourth embodiment illustrated in a schematic cross-sectional diagram in FIG. 11 is similar to the semiconductor device of the third embodiment except that a second conductive-type fourth silicon carbide region 15 with the p-type impurity concentration of $1 \times 10^{15}$ to $5 \times 10^{18}$ is formed on a bottom of the trench by oblique ion implantation, for example. It is preferable that the fourth silicon carbide region 15 become a depleted layer when the semiconductor device is turned off, preventing the insulating film from being broken. Meanwhile, a shape of the fourth silicon carbide region 15 is not limited to a mode on the bottom of the trench in FIG. 11 and this may be formed to be a region with another shape from a viewpoint of protecting the insulating film.

Fifth Embodiment

Figure 12:
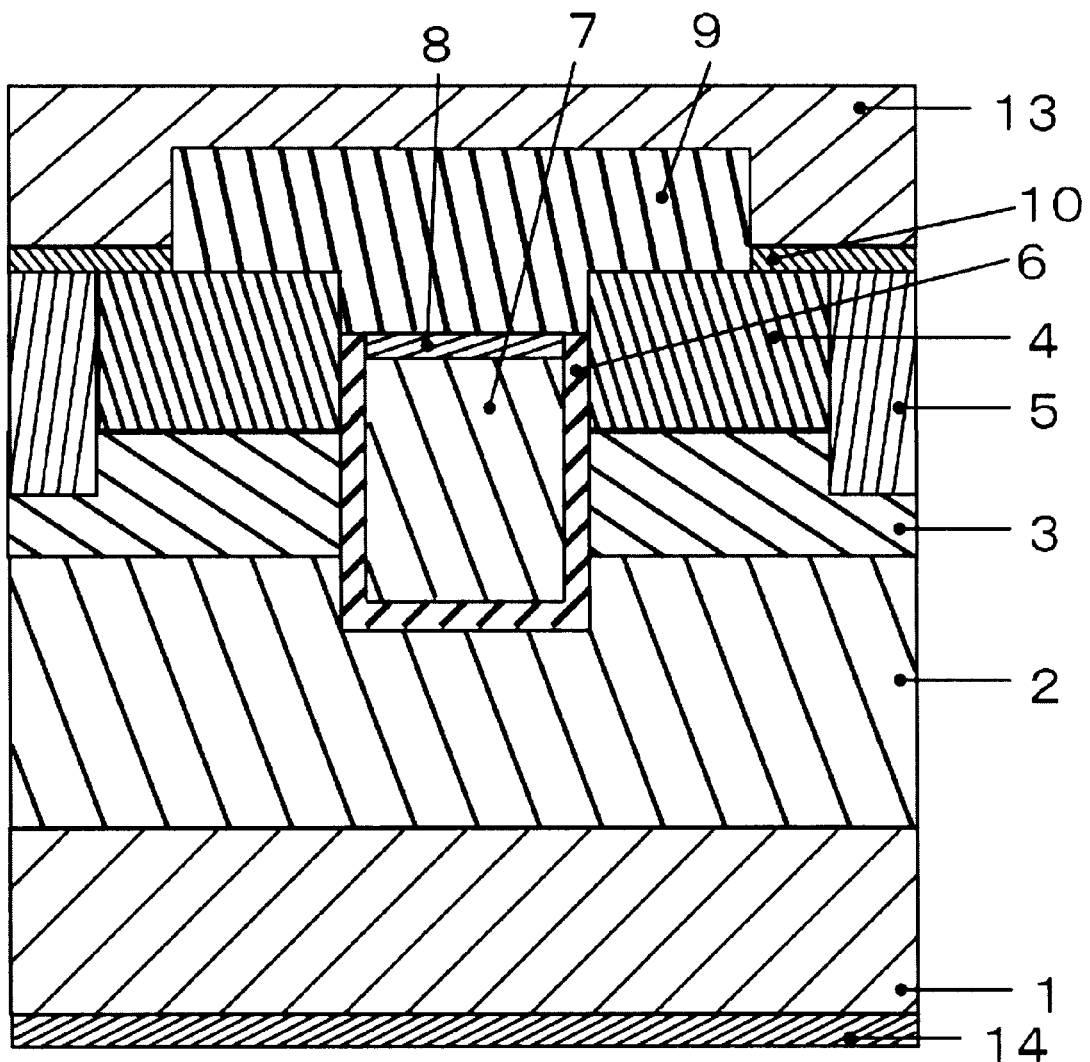
FIG. 12 is a schematic cross-sectional diagram of a semiconductor device of a fifth embodiment.

The semiconductor device of a fifth embodiment illustrated in a schematic cross-sectional diagram in FIG. 12 is similar to that of the third embodiment except that the gate insulating film 6 and the first and second electrodes (gate electrodes) 7 and 8 are formed in the trench. In this case, the depth of the trench is 0.5 to 1.5 μm.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a silicon carbide substrate including first and second principal surfaces;
a first conductive-type first silicon carbide layer provided on the first principal surface of the silicon carbide substrate;
a second conductive-type first silicon carbide region formed on a surface of the first silicon carbide layer;
a first conductive-type second silicon carbide region formed on a surface of the first silicon carbide region;
a second conductive-type third silicon carbide region formed on the surface of the first silicon carbide region;
a gate insulating film continuously formed on the surfaces of the first silicon carbide layer, the first silicon carbide region, and the second silicon carbide region;
a first electrode formed of silicon carbide formed on the gate insulating film;
a second electrode formed on the first electrode;
an interlayer insulating film for covering the first and second electrodes;
a third electrode electrically connected to the second silicon carbide region and the third silicon carbide region; and
a fourth electrode formed on the second principal surface of the silicon carbide substrate;
wherein the second silicon carbide region is adjacent to the third silicon carbide region.

2. The device according to claim 1, wherein the first electrode is formed of poly SiC or amorphous SiC.

3. The device according to claim 1, wherein the first electrode is formed of poly SiC or amorphous SiC whose work function is 4.0 eV or lower.

4. The device according to claim 1, wherein the second electrode is any of at least one of metals of Ni, Mo, Al, W, V, Co, and Ti, for example, metal silicide of the metal, mixture of the metal and the metal silicide of the metal, graphite, and graphene.

5. The device according to claim 1, wherein the fourth electrode is any of at least one of metals of Ni, Mo, Al, W, V, Co, and Ti, for example, metal silicide of the metal, mixture of the metal and the metal silicide of the metal, graphite and graphene.

6. The device according to claim 1, further comprising: a trench formed by etching the first silicon carbide layer, the first silicon carbide region, and the second silicon carbide region.

7. The device according to claim 6, wherein the first electrode is formed in the trench and on a part of the surface of the second silicon carbide region.

8. The device according to claim 6, wherein a second conductive-type fourth silicon carbide region is formed on a bottom of the trench.

9. The device according to claim 6, wherein the gate insulating film, the first electrode, and the second electrode are provided in the trench.

10. The device according to claim 1, wherein a contact anneal process is simultaneously performed to the second electrode formed on the first electrode formed of the silicon carbide on the gate insulating film and the third electrode formed on the second and third silicon carbide regions.

11. The device according to claim 10, wherein a temperature of the contact anneal is not lower than 800° C. and not higher than 1000° C.

* * * * *